United States Patent [19]

Fukushima

[11] Patent Number: 5,311,442

[45] Date of Patent: May 10, 1994

[54] TECHNOLOGY MAPPING APPARATUS FOR A COMBINATION CIRCUIT FOR USE IN AUTOMATICALLY SYNTHESIZING AN LSI LOGIC CIRCUIT

[75] Inventor: Hisayo Fukushima, Kawasaki, Japan

[73] Assignee: Fujitsu Limited, Kawasaki, Japan

[21] Appl. No.: 762,360

[22] Filed: Sep. 19, 1991

[30] Foreign Application Priority Data

Sep. 19, 1990 [JP] Japan ................................. 2-247285

[51] Int. Cl.⁵ ............................................. G06F 15/60
[52] U.S. Cl. ................................................... 364/488
[58] Field of Search ........................................ 364/488

[56] References Cited

U.S. PATENT DOCUMENTS

| | | | |
|---|---|---|---|
| 4,701,860 | 10/1987 | Mader | 364/488 |
| 4,703,435 | 10/1987 | Darringer et al. | 364/488 |
| 4,803,636 | 2/1989 | Nishiyama et al. | 364/488 |
| 4,816,999 | 3/1989 | Berman et al. | 364/488 |
| 4,827,427 | 5/1989 | Hyduke | 364/488 |
| 4,922,432 | 5/1990 | Kobayashi et al. | 364/488 |
| 4,942,536 | 7/1990 | Watanabe et al. | 364/488 |
| 4,964,056 | 10/1990 | Bekki et al. | 364/488 |

Primary Examiner—Jack B. Harvey
Assistant Examiner—Thomas Peeso
Attorney, Agent, or Firm—Staas & Halsey

[57] ABSTRACT

A graph converter converts functionally descriptive information expressing a combination circuit into a graph expression having only NOR and inversion circuits. A multiple input NOR converter detects from the above graph expression a circuit element having a NOR circuit and an inversion circuit alternately connected in series and converts the circuit element to a graph expression where a multiple input NOR circuit replaces the circuit element. A cell mapper detects from the above graph expression a circuit element having NOR circuits connected together in series, maps the circuit element to gate cells with or without a composite cell, and outputs the mapping result with the least number of gates as the mapping output for the circuit element. A circuit element having a NOR circuit and an inversion circuit alternately connected in series is substituted by a unique multiple input NOR circuit. A circuit element mapped to a composite cell is efficiently determined just by detecting a circuit element where "nor" circuits are connected together in series. It is possible to replace NOR circuits by NAND circuits.

16 Claims, 15 Drawing Sheets

TOTAL GATE NUMBER = 7

TOTAL GATE NUMBER
= 1 + 5 + 2 = 8

TOTAL GATE NUMBER
= 2 + 2 + 2 = 6

TOTAL GATE NUMBER
= 1 + 1 + 2 + 2 = 6

TOTAL GATE NUMBER = 11

TOTAL GATE NUMBER = 2 + 5 + 2 + 1 + 1 + 1 = 12

TOTAL GATE NUMBER = 2 + 1 + 3 + 3 = 9

TOTAL GATE NUMBER = 2 + 1 + 1 + 2 + 3 = 9

TOTAL GATE NUMBER = 2 + 3 + 1 + 3 = 9

TOTAL GATE NUMBER = 2 + 2 + 1 + 1 + 1 + 2 = 9

TOTAL GATE NUMBER = 2 + 1 + 1 + 1 + 5 + 2 = 12

TOTAL GATE NUMBER = 2 + 3 + 1 + 3 = 9

TOTAL GATE NUMBER = 2 + 1 + 3 + 2 = 8

TECHNOLOGY MAPPING APPARATUS FOR A COMBINATION CIRCUIT FOR USE IN AUTOMATICALLY SYNTHESIZING AN LSI LOGIC CIRCUIT

BACKGROUND OF THE INVENTION

1. Field of the Invention

This invention relates to a technology mapping apparatus for a CMOS-LSI combination circuit configured by a logic circuit automatic synthesis technology.

2. Description of the Related Art

Automatically synthesizing a CMOS-LSI combination circuit requires a technology which not only reduces the number of gates but also enables the respective circuit elements in a combination circuit to be mapped to actually realizable gate cells (or simply cells below). This technology is referred to as technology mapping.

Technology mapping maps, through appropriate transformation, the respective circuit elements of a combination circuit to a plurality of actually realizable cells prestored in a cell library.

The conventional art of technology mapping is as follows: First, a combination circuit is expressed by a graph of a NAND circuit (NAND) or NOR circuit having two (2) input terminals and an inverter (INV). This is the case for all patterns stored in the cell library. By searching the respective circuit elements in a combination circuit for matching graphs in the cell library, the mapping technology causes the circuit elements to be mapped to the matched cell.

However, since the above prior art needs to have a cell library which stores the graphs corresponding to all possible patterns formed as respective circuit elements, it is disadvantageous because the cell library must store a huge volume of data and the matching step requires a huge processing volume.

When a graph matches with a NAND cell having five (5) input terminals, for instance, the graph also matches with NAND of cells having four (4), three (3) and two (2) input terminals. Therefore, when a cell has mores than two (2) input terminals, the same path in the cell library is searched multiple times. This causes a problem in that the matching process becomes very inefficient.

Furthermore, since the cell library has plural kinds of cells which match the respective circuit elements, the combination circuit having the minimum number of gates must be found among all possible combinations of cells to which respective circuit elements are mapped. Hence, a problem arises in that the processing volume becomes enormously large.

SUMMARY OF THE INVENTION

This invention is designed to solve the above described problems. It aims at efficiently obtaining the circuit with a reduced number of gates by eliminating the necessity for searching duplicate paths in a cell library and for finding the combination circuit having the minimum number of gates among all possible combinations of cells to which respective circuit elements are mapped.

This invention is configured with the following elements:

First, a graph converter converts functionally descriptive information about a combination circuit into a graph expression having only "nor" (or "nand") and inversion circuits.

Second, a multiple input "nor" (or "nand") converter detects from the above graph expression a circuit element having a "nor" (or "nand") circuit and an inversion circuit alternately connected in series, then converts the circuit element to a graph expression where a multiple input "nor" (or "nand") circuit replaces the circuit element.

Third, a cell mapper detects from the above graph expression a circuit element having "nor" (or "nand") circuits connected together in series, maps the circuit element to gate cells with or without a composite cell, and outputs the mapping result with the least number of gates as the mapping output for the circuit element.

Here, the graph converter can be configured to further comprise a graph separator for individually outputting graphs separated by a net having at least one (1) fanout from the graph expression converted by itself.

Since this invention with the above configuration causes a circuit element having a "nor" (or "nand") circuit and an inversion circuit alternately connected in series to be substituted by a unique multiple input "nor" (or "nand") circuit, it simplifies the graph expression of the mapped objects, thereby reducing the volume of data to be processed during mapping.

Because the simplified graph expression is uniquely obtained by an algorithm, this invention eliminates processing that has been needed to obtain the matched cells by searching the same path on a graph as in the conventional art.

Furthermore, this invention efficiently allows the above simplified graph expression to determine a circuit element to be mapped to a composite cell just by detecting the circuit element where "nor" (or "nand") circuits are connected together in series.

BRIEF DESCRIPTION OF THE DRAWINGS

Those familiar with this field can easily recognize additional objects and features of this invention from the attached drawings and a preferred embodiment of this invention.

DESCRIPTION OF THE PREFERRED EMBODIMENT

Description of the Principle

Figure 1:
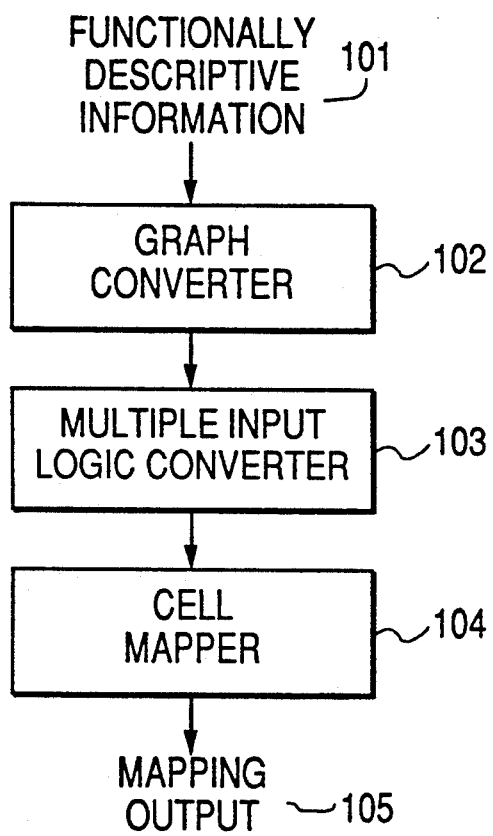
FIG. 1 is a block diagram of this invention.

FIG. 1 is a block diagram of this invention.

This invention is based on a technology mapping apparatus which maps a combination circuit to a cell that forms an LSI logic circuit.

Elements configuring this invention operate as follows:

First, a graph converter 102 converts functionally descriptive information 1 01 about a combination circuit into a graph expression having only a "nor" circuit and an inversion circuit. Here, the graph converter 102 can be configured to further comprise a graph separator for individually outputting graphs separated by a net having at least one (1) fanout from the graph expression converted by itself.

Second, a multiple input logic converter 103 detects from the above graph expression a circuit element having a "nor" circuit and an inversion circuit alternately connected in series, then converts the circuit element to a graph expression where a multiple input "nor" circuit replaces the circuit element.

Third, a cell mapper 104 detects, from the above graph expression obtained by the multiple input logic converter 103, a circuit element having "nor" circuits connected together in series, maps the circuit element to a gate cell, e.g. stored in a cell library, with or without a composite cell, and outputs the mapping result with the least number of gates as the mapping output 105 for the circuit element.

The above configuration is entirely similar even when a "nor" circuit is replaced by a "nand" circuit.

Since this invention with the above configuration shown in FIG. 1 causes the multiple input logic converter 103 to substitute the circuit element having a "nor" circuit and an inversion circuit alternately connected in series for a unique multiple input "nor" circuit, it simplifies the graph expression of the mapped objects, thereby reducing the volume of data to be processed during mapping.

Because the simplified graph expression is uniquely obtained by an algorithm, this invention eliminates processing that has been needed to obtain the matched cells by searching the same path on a graph as in the conventional art.

Furthermore, this invention allows the cell mapper 104 to efficiently determine, from the above simplified graph expression, a circuit element where a composite cell is mapped just by detecting the circuit element where "nor" circuits are connected together in series.

EXPLANATION OF THE PREFERRED EMBODIMENT

A preferred embodiment of this invention is described below by referring to an attached drawing.

Figure 2:
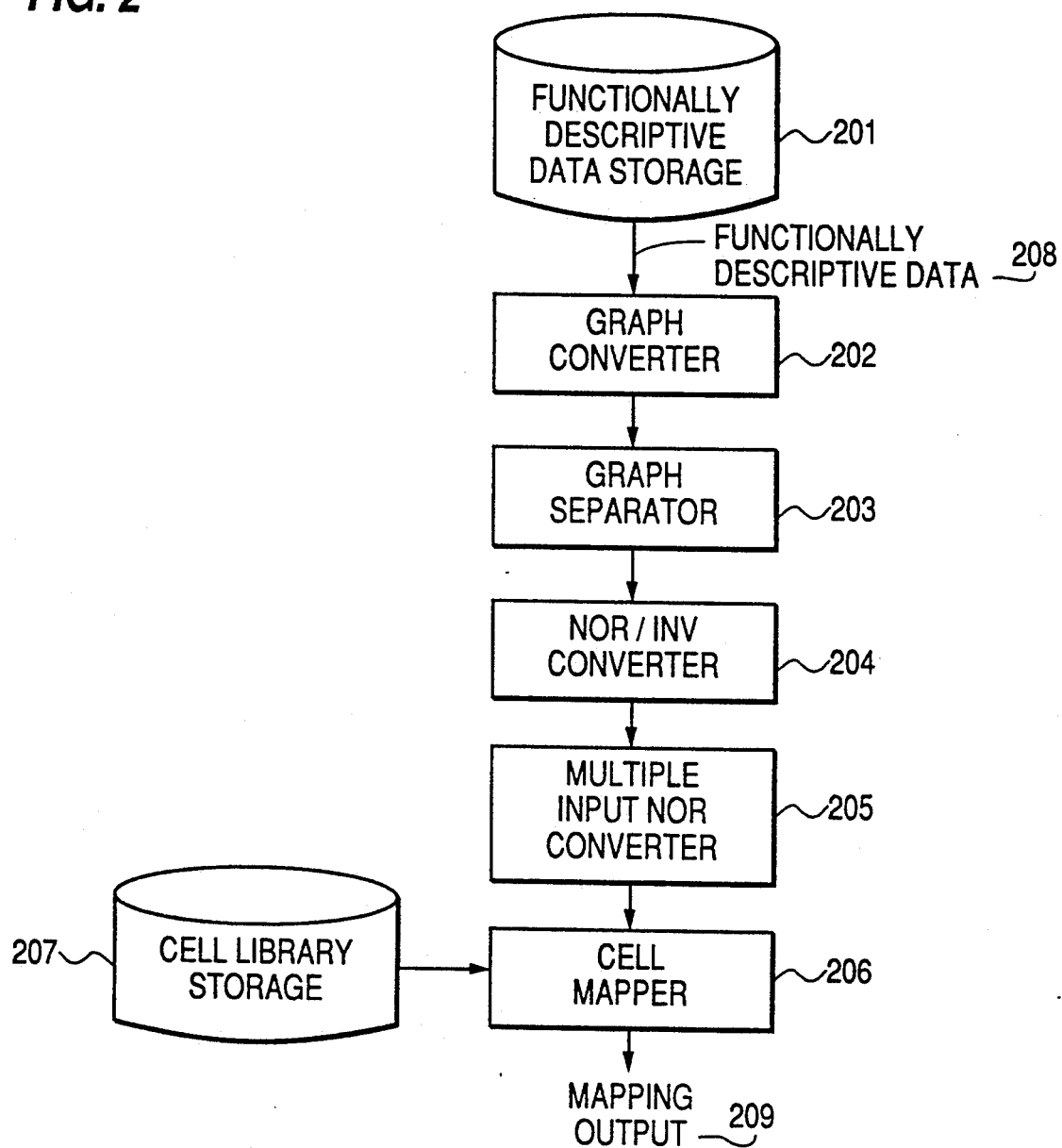
FIG. 2 is a block diagram of a preferred embodiment of this invention.

FIG. 2 is a block diagram of a preferred embodiment of this invention.

A functionally descriptive data storage 201 stores functionally descriptive data 208 expressing a combination circuit in a form such as a block diagram, descriptive language, state transition diagram and a truth table.

A graph converter 202 converts the functionally descriptive data 208 outputted from the functionally descriptive data storage 201 to a graph expression. Since a cell library for technology mapping for synthesizing a CMOS-LSI logic circuit has a terminal configuration with multiple inputs and a single output, a graph can easily express a circuit.

A graph separator 203 separates graph data outputted from the graph converter 202 by a net having more than one (1) fanout. That is, a net connecting one (1) output terminal with multiple input terminals, i.e. a net having more than one (1) fanout, can be used to create individual graph expressions by the respective connections to the above input terminals.

Next, a NOR/INV converter 204 replaces graph data outputted from the graph separator 203 with a graph expression having only a "nor" circuit and an inversion circuit. That is, the logic operators including AND, NAND, OR and NOR can all be replaced by NOR (or NAND) and INV. AND, NAND and OR can be replaced by using the following rules:

$$A \text{ AND } B = \overline{\overline{A \text{ AND } B}} = \overline{\overline{A} \text{ OR } \overline{B}} = \overline{A} \text{ NOR } \overline{B}$$

$$A \text{ NAND } B = \overline{A \text{ AND } B} = \overline{A} \text{ NOR } \overline{B}$$

$$A \text{ OR } B = \overline{\overline{A \text{ OR } B}} = \overline{A \text{ NOR } B}$$

The NOR/INV converter 204 performs the conversion of logic operators into a combination of NOR and INV according to these rules.

The multiple input NOR converter 205 searches a graph expressing a multiple input NOR from among the graph data received from the NOR/INV converter 204 and replaces the searched part with one multiple input NOR graph expression. That is, a multiple input NOR graph expression can be a substitute for a graph expression representing a circuit part with NOR-INV-NOR . . . . connections within the graph data.

Figure 3A:
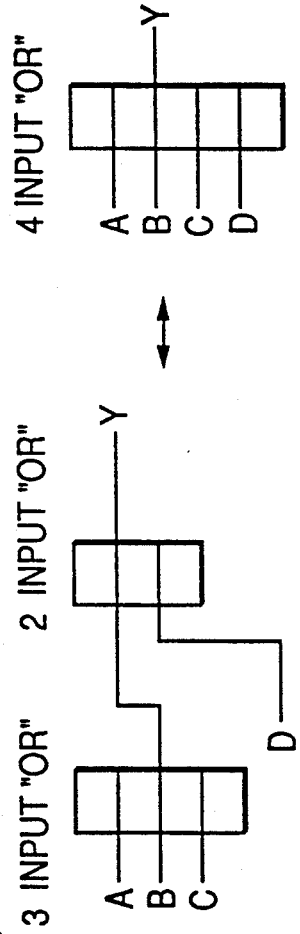
FIG. 3A illustrates the equivalence between more than one multiple input OR and one multiple input.
Figure 3B:
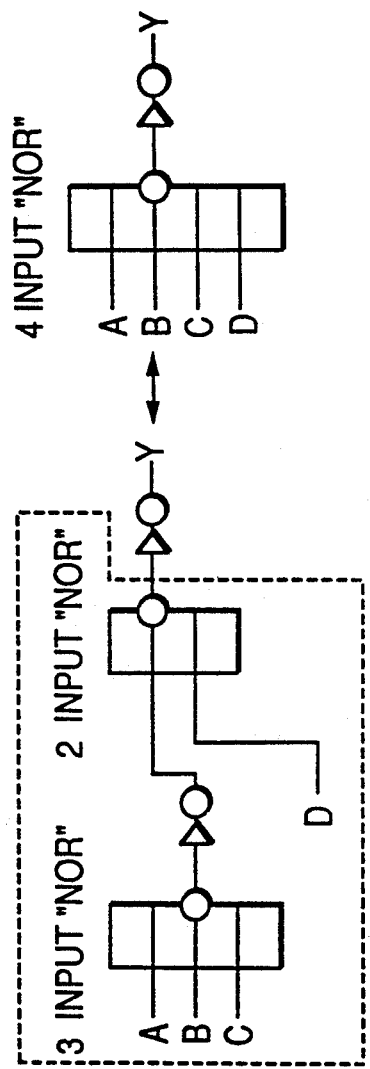
FIG. 3B illustrates the equivalence between more than one multiple input NOR and one multiple input NOR.

FIG. 3A illustrates the equivalence between more than one multiple input OR and one multiple input OR, and FIG. 3B illustrates the equivalence between more than one multiple input NOR and one multiple input NOR.

As shown in FIG. 3A, a three (3) input OR connected with a two (2) input OR can be replaced by a four (4) input OR. As shown in FIG. 3B, a three (3) input NOR connected through an INV with a two (2) input NOR (encased by dashed lines) can be similarly replaced by a four (4) input NOR.

The multiple input NOR converter 205 executes algorithms for such replacements.

A sign "—|>O—" shown in FIGS. 3A and 3B through FIG. 12 represents an INV (inverter).

A cell mapper 206 searches the received graph data outputted from the multiple input NOR converter 205 for the parts matching a composite cell by referring to a cell library storage 207. The number of gates when the searched part is mapped to a gate cell without a composite cell is compared with the number of gates when the searched part is mapped to a gate cell with a composite cell, to finally execute the mapping with the least gate cells. The part not matching a composite cell is mapped to a single cell thus minimizing the number of gates.

A single composite cell with a small number of gates can perform the same function obtained by a combination of gate cells in technology mapping for synthesizing a CMOS-LSI logic circuit. Additionally, there is an interchangeability between such a composite cell and a circuit realized as a combination of a NOR and an INV.

Figures 4A, 4B:
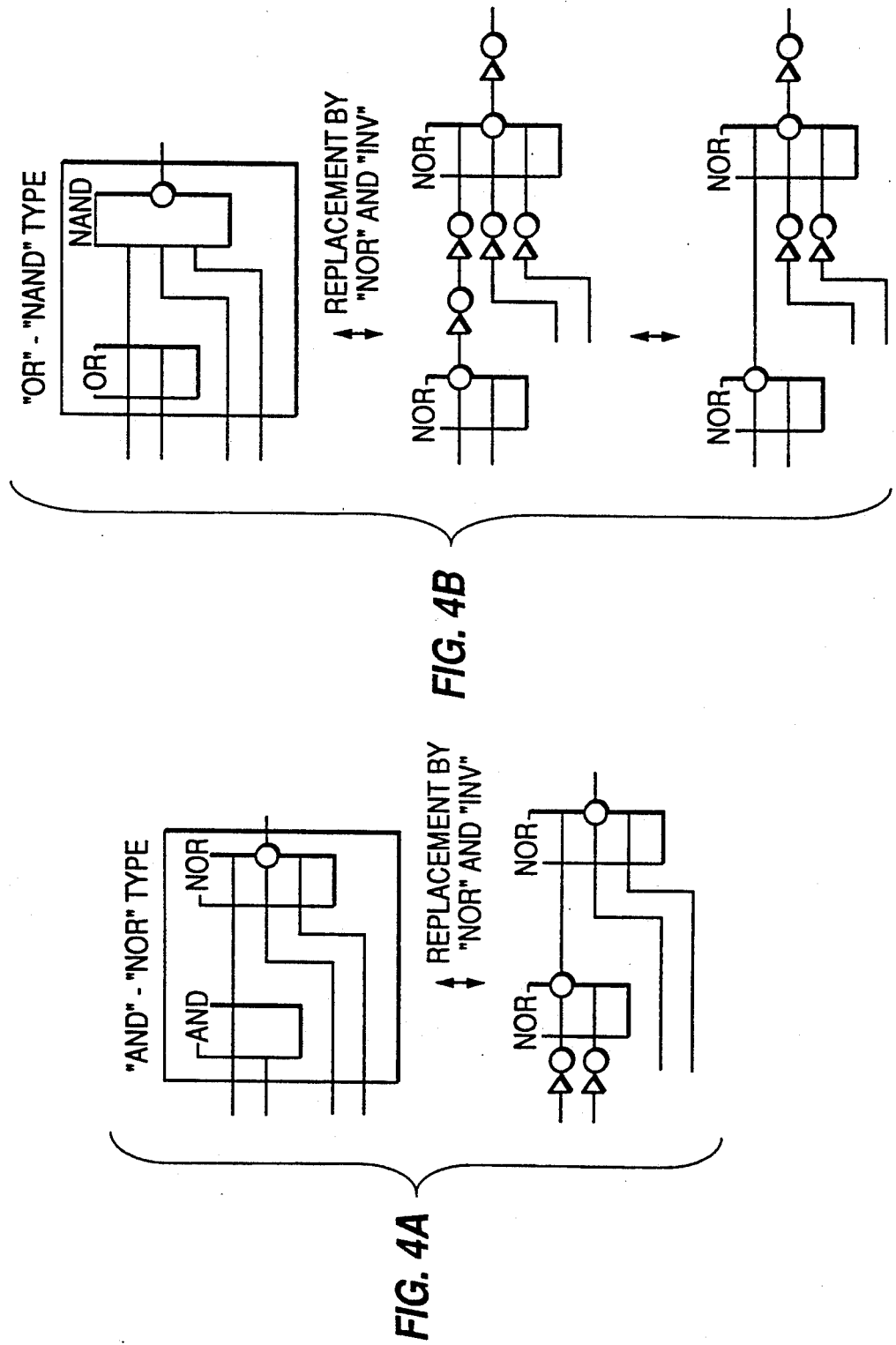
FIG. 4A illustrates the equivalence between an AND-NOR type composite cell and a NOR-INV combination circuit.
FIG. 4B illustrates the equivalence between an OR-NAND type composite cell and a NOR-INV combination circuit.

FIG. 4A illustrates the equivalence between an AND-NOR type composite cell and a NOR-INV combination circuit, and FIG. 4B illustrates the equivalence between an OR-NAND type composite cell and a NOR-INV combination circuit.

It is understood that such equivalences enable reversible replacements as is evident from FIGS. 4A and 4B where a composite cell can be a substitute for a NOR-NOR combination circuit.

Therefore, the cell mapper 206 searches a NOR-NOR combination circuit for a match with a composite cell by referring to the cell library storage 207, as described earlier. To finally execute the mapping with the least gate cells, the cell mapper 206 compares the number of gates when the searched part is mapped to a gate cell without a composite cell with the number of gates when the searched part is mapped to a gate cell with a composite cell. This enables replacement of combination circuits as necessary.

Thus, a mapping output 209 is obtained by mapping a combination circuit to a realizable CMOS-LSI logic circuit.

The concrete action of the preferred embodiment of this invention shown in FIG. 2 is discussed below.

Figure 5:
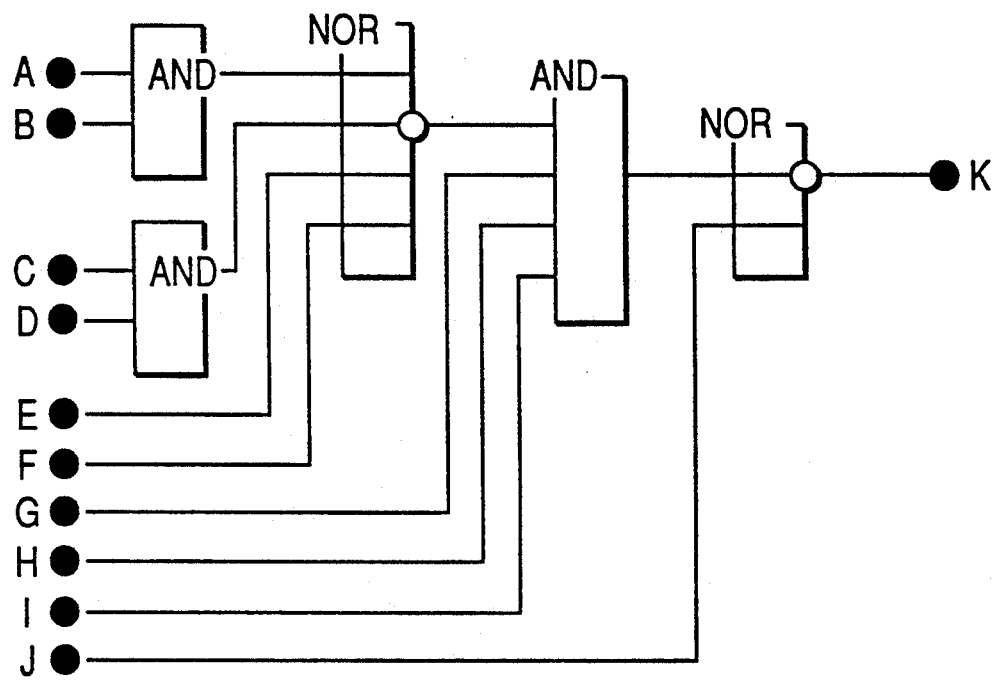
FIG. 5 shows an example of a target combination circuit.

FIG. 5 shows an example of a target combination circuit.

Assume here that the functionally descriptive data storage 201 stores the functionally descriptive data 208, shown in FIG. 5, e.g. of the combination circuit for which technology mapping is to be performed where A through i designate external input terminals and K designates an external output terminal.

Figure 6:
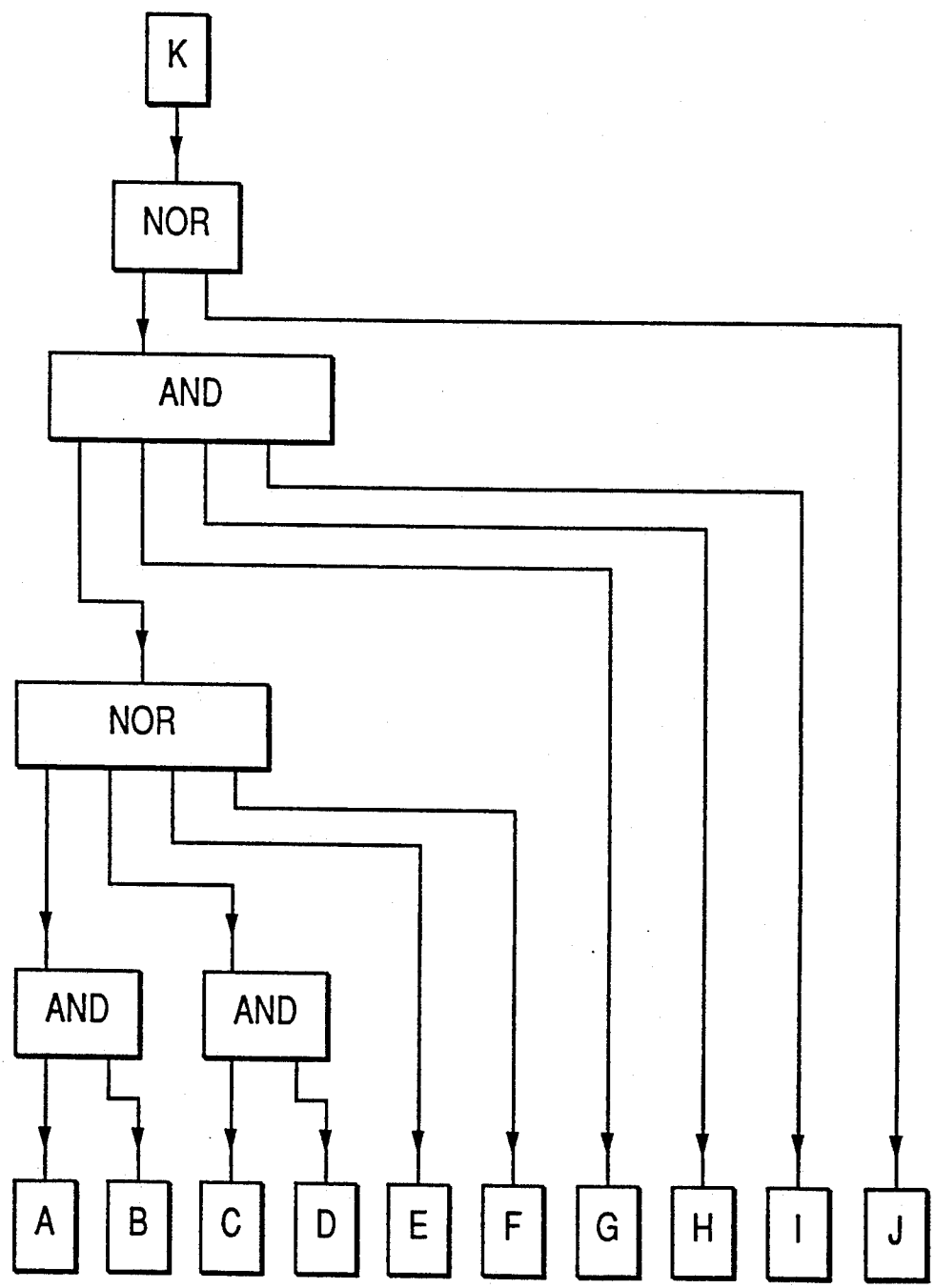
FIG. 6 shows an example of a graph conversion.

FIG. 6 shows an example of a graph conversion.

The graph converter 202 converts the received functionally descriptive data 208 corresponding to the circuit shown in FIG. 5 into a graph expression shown in FIG. 6. Here, the connection between the input terminals and the output terminal is set as an arc with the external output terminal K being the root, AND and NOR elements being nodes, and the external input terminals A through i being phyllomes.

As described earlier, the graph separator 203 is supposed to separate the received graph data corresponding to the graph expression shown in FIG. 6 with a net having more than one(1) fanout. Yet, since the graph expression shown in FIG. 6 does not have such a net, the graph separator 203 outputs "as is" the graph data corresponding to FIG. 6.

Figure 7:
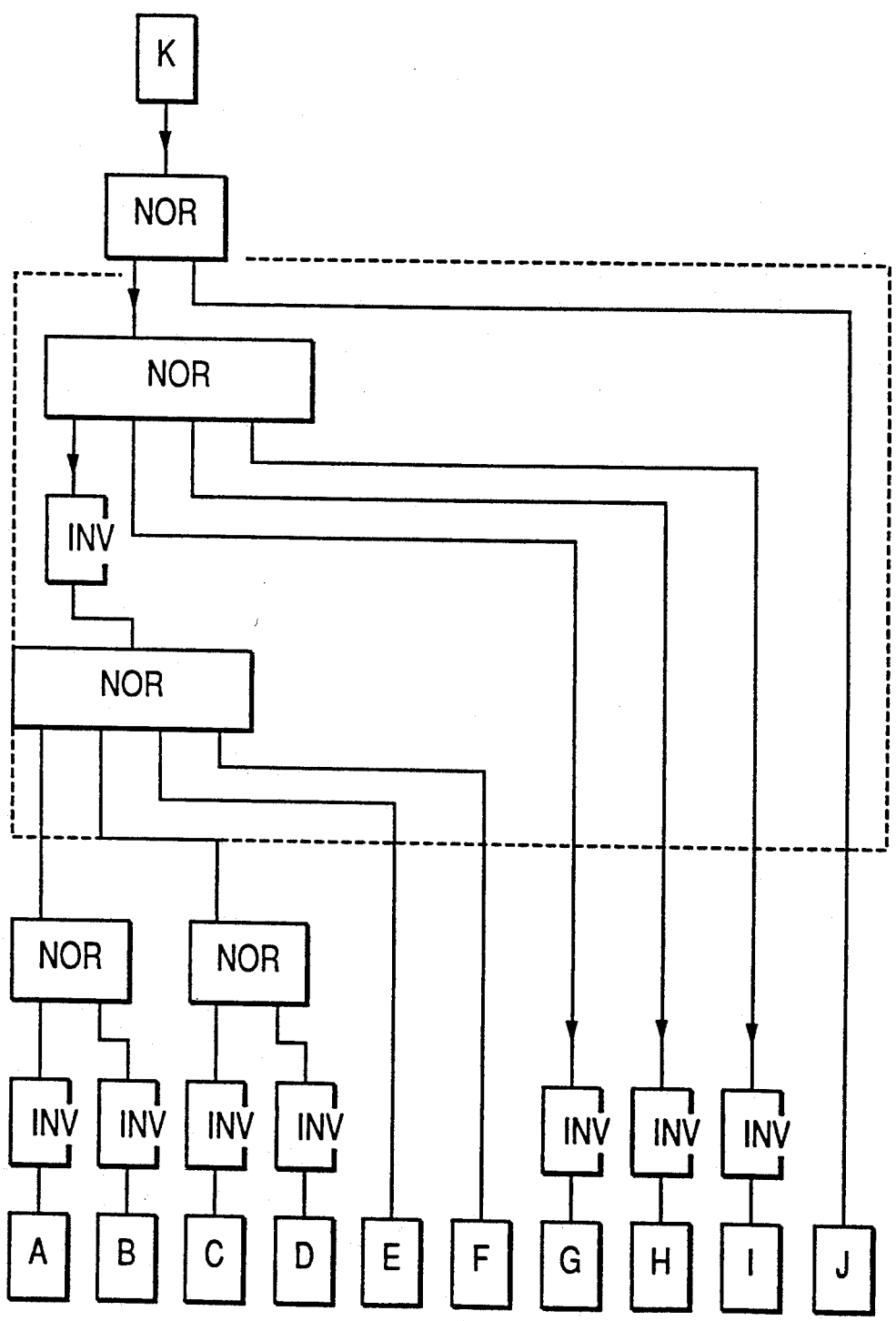
FIG. 7 shows an example of a NOR/INV conversion.

FIG. 7 shows an example of a NOR/INV conversion.

The NOR/INV converter 204 converts the received graph data corresponding to the graph expression shown in FIG. 6 into graph data corresponding to the graph expression including only NORs and INVs shown in FIG. 7.

Figure 8:
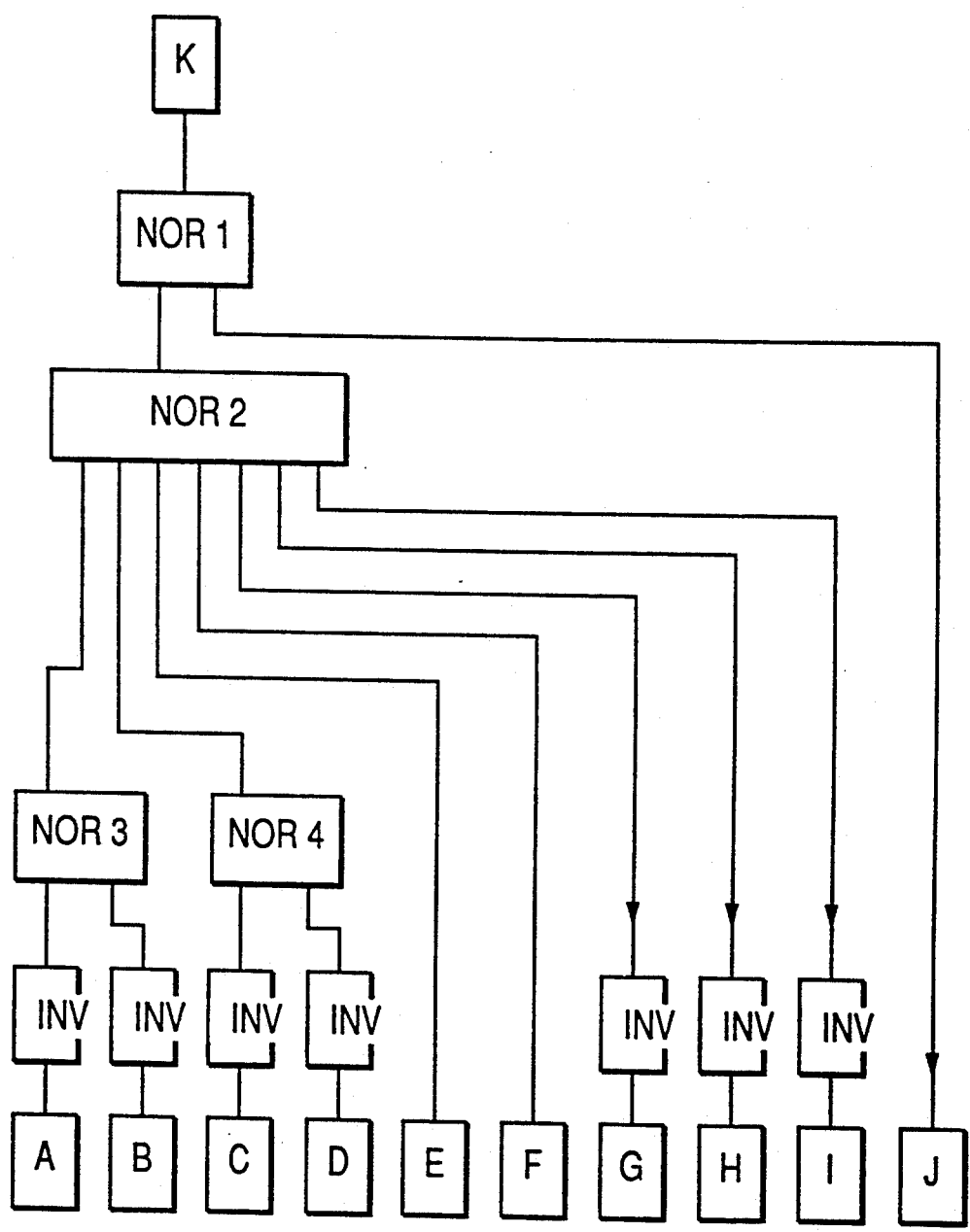
FIG. 8 shows an example of a multiple input NOR converter.

FIG. 8 shows an example of a multiple input NOR conversion.

The multiple input NOR converter 205 searches the received graph data corresponding to the graph expression including only NORs and INVs shown in FIG. 7 for a graph expressing a multiple input NOR. FIG. 8 shows a result of replacing the graph encased in the dashed lines in FIG. 7 with a seven (7) input NOR, NOR2, where NOR1 through NOR4 designate the respective NORs for convenience of explanation.

The cell mapper 206 refers to the cell library storage 207 and searches the received graph data corresponding to the graph expression shown in FIG. 8 for a match with any of the various composite cells in the cell library 207 as a NOR-NOR connection part.

As a result, the cell mapper 206 detects a composite cell matching e.g. the connection between NOR1 and NOR2 shown in FIG. 8.

FIGS. 9A through 9D show a first group of processing examples created by the cell mapper 206.

Figure 9A:
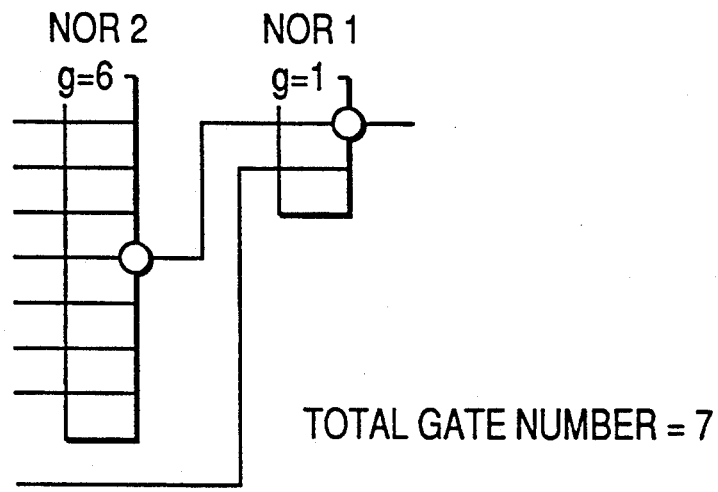
FIG. 9A through 9D show a first group of processing examples created by the cell mapper.

In FIGS. 9A throughout 11C, "g=" represents the number of gates in a cell.

First, the cell mapper 206 refers to the cell library storage 207 and maps the above connection between NOR1 and NOR2 to gate cells without a composite cell, which produces the mapping result such as that shown in FIG. 9A, where the cell mapper 206 maps it to a cell having six (6) gates and a cell having one (1) gate for a total of seven (7) gates.

Figure 9B:
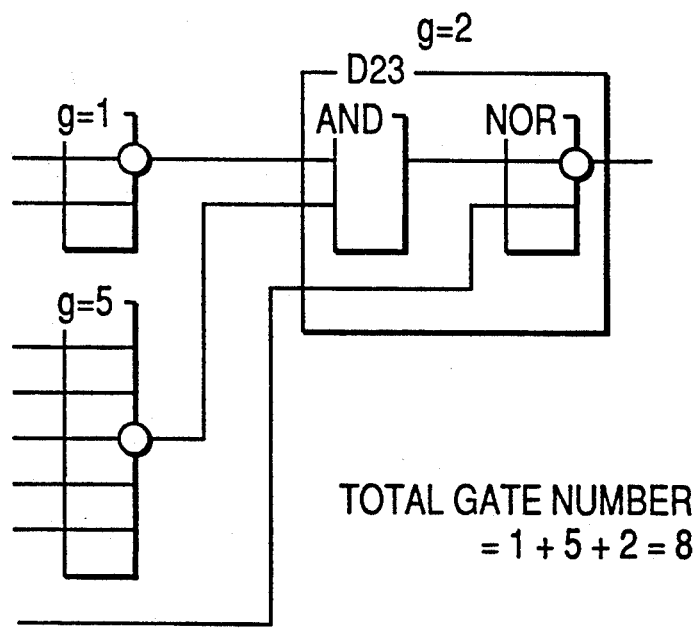
Figure 9C:
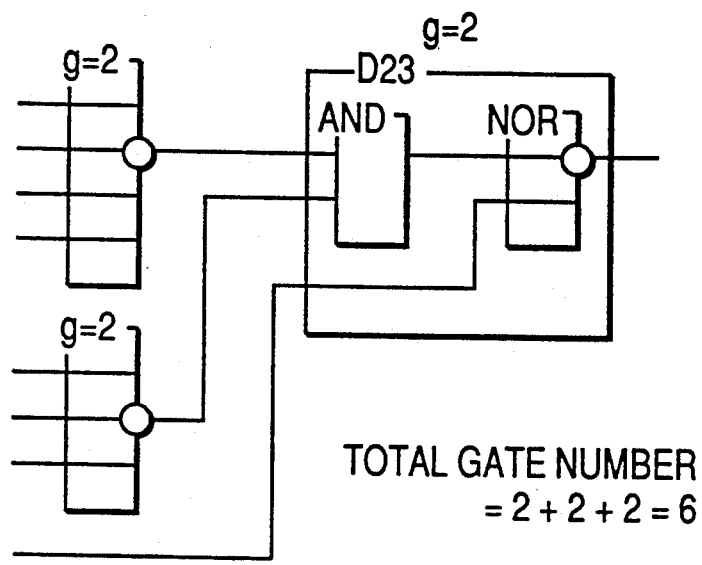
Figure 9D:
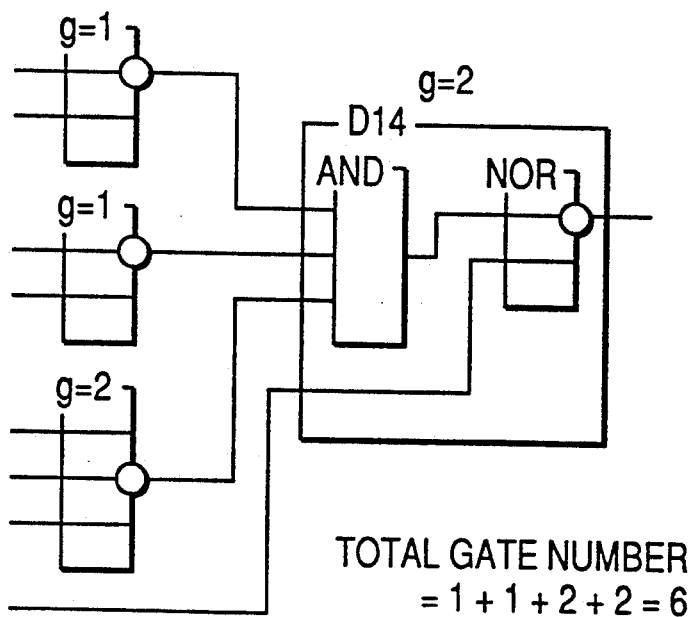

Second, the cell mapper 206 refers to the cell library storage 207 and maps the above connection between NOR1 and NOR2 to gate cells with a composite cell, which produces three (3) mapping results such as those shown in FIGS. 9B, 9C and 9D. FIGS. 9B and 9C show cases where the above connection between NOR1 and NOR2 matches gate cells with a composite cell of which type is called D23 with respective totals of eight (8) and six (6) gates. FIG. 9D shows a case where the above connection between NOR1 and NOR2 matches gate cells with a composite cell of which type is called D14 with a total of six (6) gates.

By selecting a result with the least number of gates from the above mapping results, the cell mapper 206 finally maps the above connection between NOR1 and NOR2 to the gate cells with a composite cell e.g. shown in FIG. 9D. When multiple results have the least-number of gates, all of them can be outputted for further consideration.

Next, the cell mapper 206 detects a composite cell matching e.g. the connection between NOR2 and NOR3 or between NOR2 and NOR4 shown in FIG. 8.

FIGS. 10A through 10F show a second group of processing examples created by the cell mapper 206.

The description of this case is similar to that of the above described case of the connection between NOR1 and NOR2. First, the cell mapper 206 refers to the cell library 207 and maps the above connection between NOR2 and NOR3 or between NOR2 and NOR4 to gate cells without a composite cell. This produces the mapping result shown in FIG. 10A, where the cell mapper 206 maps it to a cell having two (2) gates, a cell having six (6) gates, and three (3) cells each having one (1) gate for a total of eleven (11) gates.

Figure 10A:
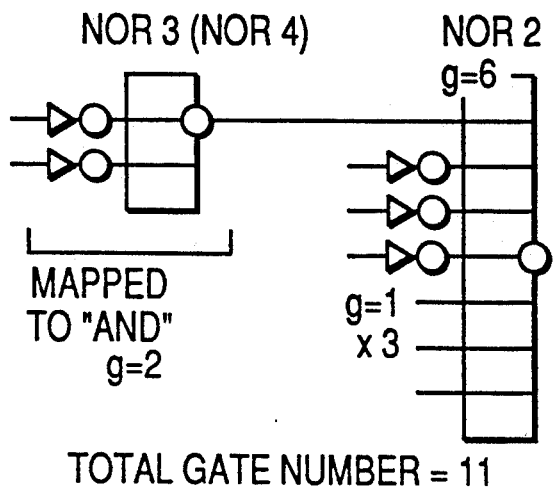
FIGS. 10A through 10F show a second group of processing examples created by the cell mapper.
Figure 10B:
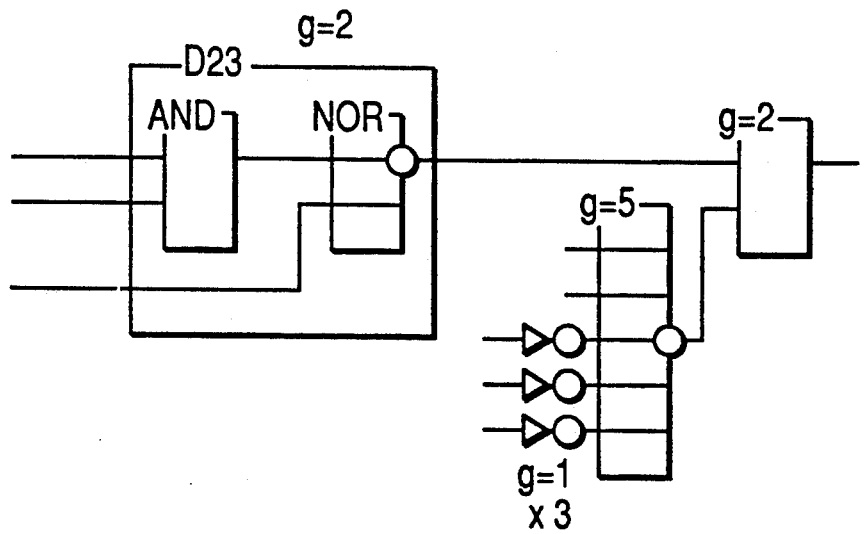
Figure 10C:
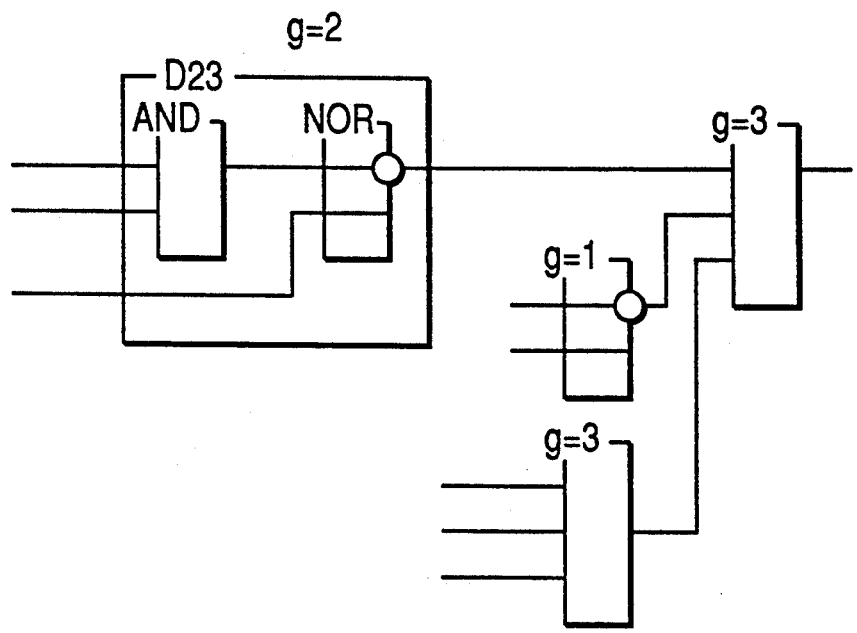
Figure 10D:
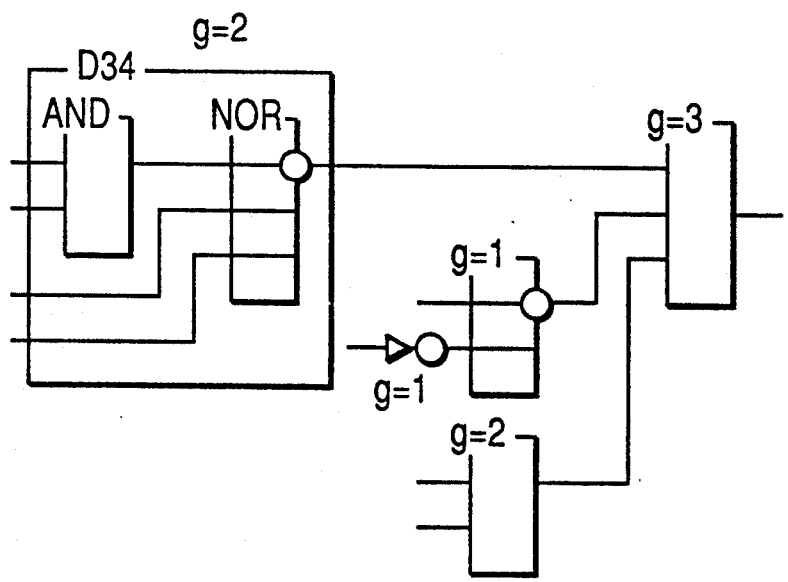
Figure 10E:
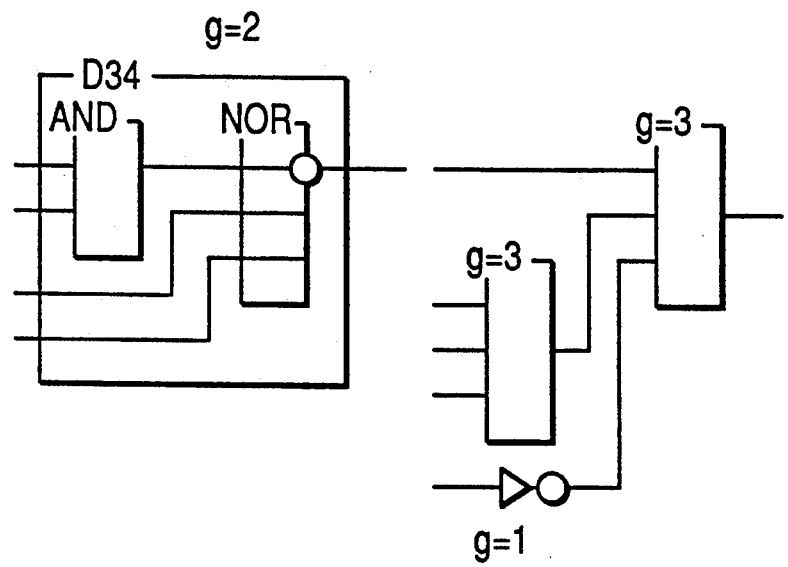
Figure 10F:
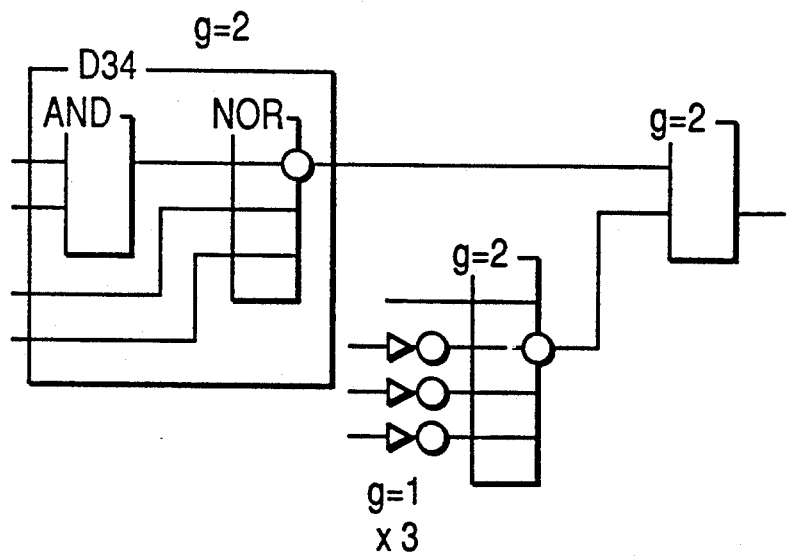

Second, the cell mapper 206 refers to the cell library storage 207 and maps the above connection between NOR2 and NOR3 or between NOR2 and NOR4 to gate cells with a composite cell, which produces five (5) mapping results as shown in FIGS. 10B through 10F. FIGS. 10B and 10C show cases where the above connection between NOR2 and NOR3 or between NOR2 and NOR4 matches gate cells with a composite cell of which type is called D23 with respective totals of eight (8) and six (6) gates. FIGS. 10D, 10E and 10F show cases where the above connection between NOR2 and NOR3 or between NOR2 and NOR4 matches gate cells with a composite cell of which type is called D34 with respective totals of twelve (12) gates, nine (9) gates, nine (9) gates, and nine (9) gates.

Figure 11A:
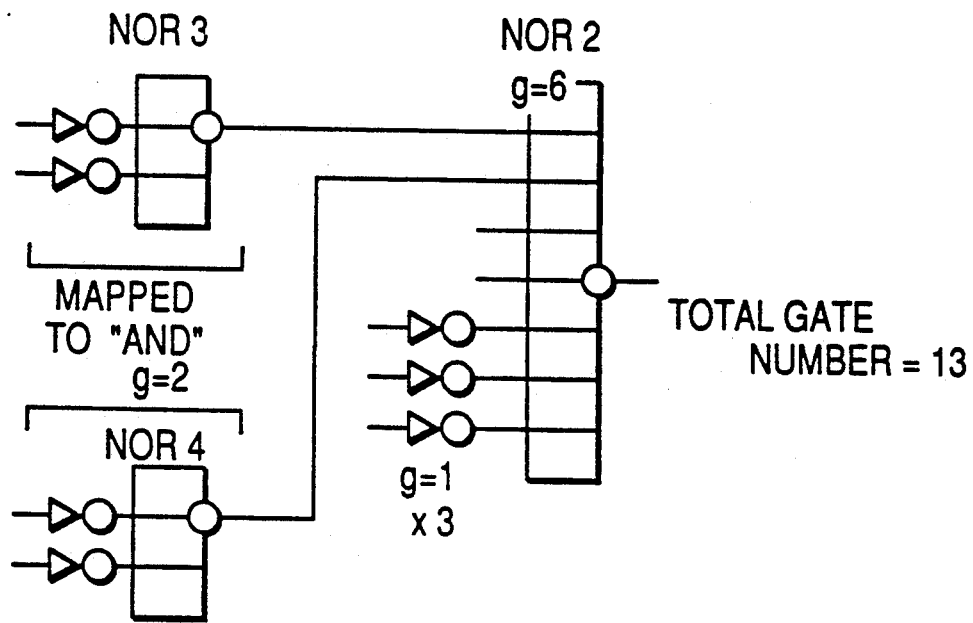
FIGS. 11A, 11B and 11C show a third group of processing examples created by the cell mapper.
Figure 11B:
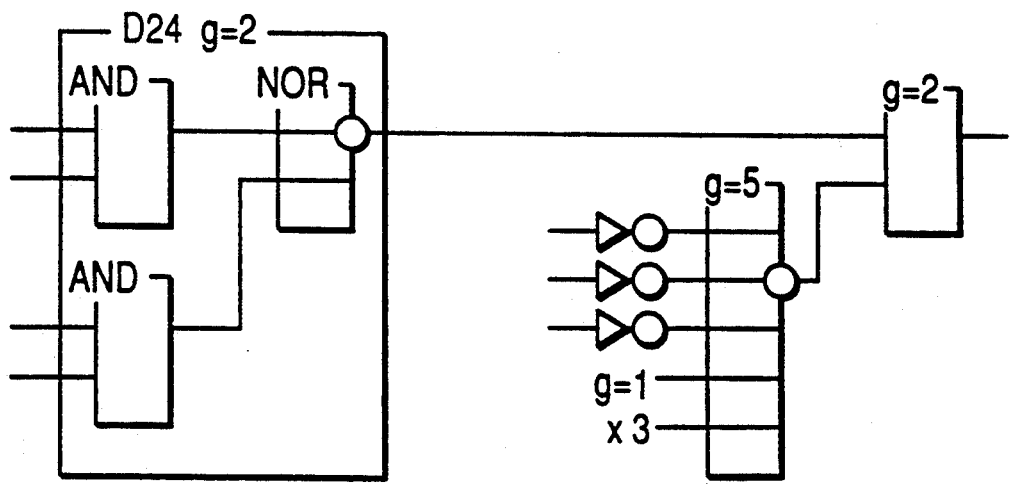
Figure 11C:
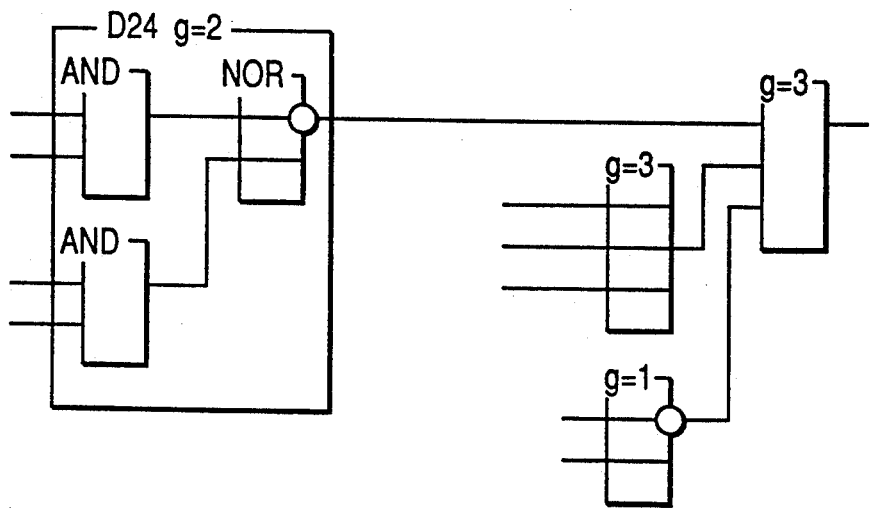

FIGS. 11A, 11B and 11C show a third group of processing examples by the cell mapper 206.

Similarly, the cell mapper 206 also detects a composite cell matching the joint connections among NOR2, NOR3 and NOR4 shown in FIG. 8.

First, the cell mapper 206 refers to the cell library 207 and maps the above joint connection among NOR2, NOR3 and NOR4 to gate cells without a composite cell, which produces the mapping result shown in FIG. 11A, where the cell mapper 206 maps it to two (2) cells each having two (2) gates, one (1) cell having six (6) gates, and three (3) cells each having one (1) gate for a total of thirteen (13) gates.

Second, the cell mapper 206 refers to the cell library 207 and maps the above joint connections among NOR2, NOR3 and NOR4 to gate cells with a composite cell, which produces two (2) mapping results as shown in FIGS. 11B and 11C. FIGS. 11B and 11C show cases where the above joint connections among NOR2, NOR3 and NOR4 match gate cells with a composite cell of a type called D24 with respective totals of twelve (12) gates and nine (9) gates.

By selecting the least number of gates from the above mapping results, the cell mapper 206 finally maps the above joint connection among NOR2, NOR3 and NOR4 to the gate cells with a composite cell as shown in FIG. 11C.

Figure 12:
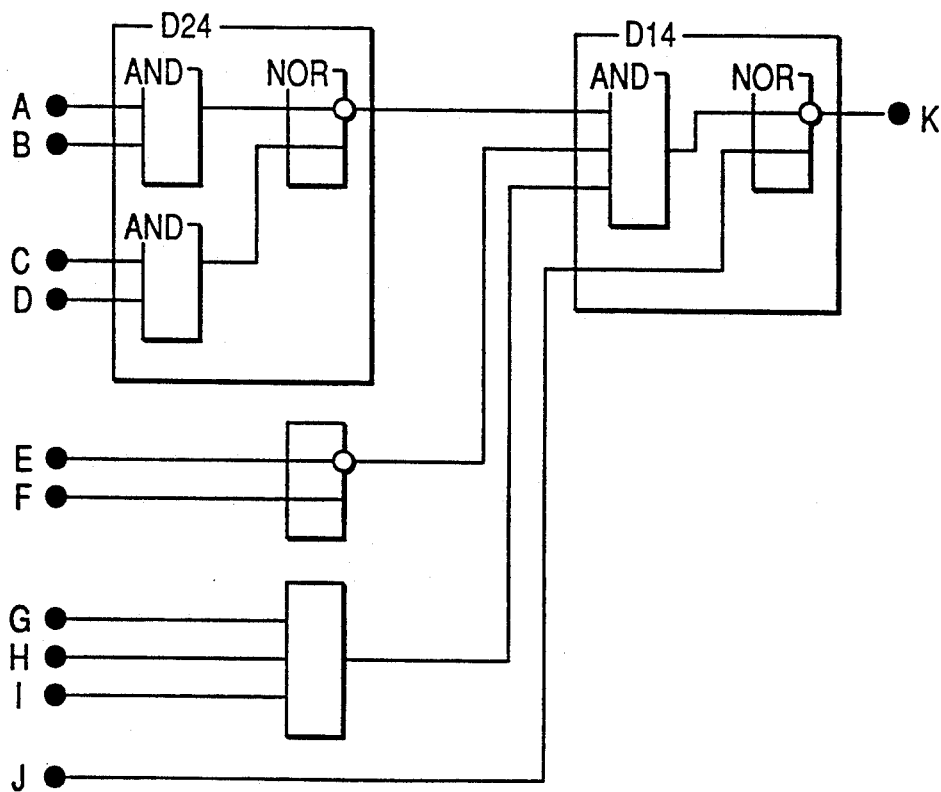
FIG. 12 shows an example of a final processing result created by the cell mapper.

FIG. 12 shows an example of a final processing result created by the cell mapper.

Also, when the cell mapper 206 does not detect a composite cell matching a connection shown in FIG. 8, it maps such a connection to gate cells without a composite cell, which minimize the total number of gates. By combining the mapping results when the cell mapper 206 does and does not detect a composite cell matching a connection shown in FIG. 8, the cell mapper 206 finally outputs the mapping output 209 shown in FIG. 12 in response to the functionally descriptive data 208 corresponding to the combination circuit shown in FIG. 5.

The above described embodiment can have the following alternative configuration.

A NAND/INV converter (not shown in FIG. 2) converts the same graph data NOR/INV converter 204, obtained from the functionally descriptive data 208 through a reference to the functionally descriptive data storage 201 and processings by the graph converter 202 and the graph separator 203 to a graph expression having only "nand" and inversion circuits. A multiple input NAND converter (not shown in FIG. 2 either) searches a graph expressing a multiple input NAND from among the graph data received from the NAND/INV converter and replaces the searched part with one multiple input NAND graph expression in a manner similar to multiple input NOR converter 205. That is, a multiple input NAND graph expression can be a substitute for a graph expression representing a circuit part with NAND-INV-NAND .... connections within the graph data.

In this case, the cell mapper 206 refers to the cell library storage 207 and maps the graph data outputted from the multiple input NAND converter to cells, then outputs the result with the least number of gates as the mapping output 209.

What is claimed is:

1. A technology mapping apparatus for automatically synthesizing an LSI logic circuit by mapping circuit elements of a combination circuit to cells which form said LSI logic circuit, comprising:
   graph converting means for converting functionally descriptive information expressing a combination circuit into a first graph expression having only NOR and inversion circuits;
   multiple input NOR converting means for detecting from the first graph expression a circuit element having a NOR circuit and an inversion circuit alternately connected in series and for converting said circuit element to a second graph expression where a multiple input NOR circuit replaces said circuit element; and
   cell mapping means for detecting from at least one of the first and second graph expressions a circuit element having NOR circuits connected together in series, for mapping said circuit element to at least one of a plurality of sets of gate cells, at least some of the sets of the gate cells including a composite cell, and for outputting a mapping result with a minimum number of gates as a mapping output for said circuit element.

2. The technology mapping apparatus for automatically synthesizing an LSI logic circuit my mapping circuit elements of a combination circuit to cells which form said LSI logic circuit, according to claim 1, wherein said graph converting means further comprises graph separating means for individually outputting graphs separated by a net having at least one fanout from the first graph expression.

3. A technology mapping apparatus for automatically synthesizing an LSI logic circuit by mapping circuit elements of a combination circuit to cells which form said LSI logic circuit, comprising:
   graph converting means for converting functionally descriptive information expressing a combination circuit into a first graph expression having only NOR and inversion circuits;
   multiple input NOR converting means for detecting from the first graph expression a circuit element having a NOR circuit and an inversion circuit alternately connected in series and for converting said circuit element to a second graph expression where a multiple input NOR circuit replaces said circuit element; and
   means for executing technology mapping for the second graph expression obtained by said multiple input NOR converting means.

4. The technology mapping apparatus for automatically synthesizing an LSI logic circuit by mapping circuit elements of a combination circuit to cells which form said LSI logic circuit, according to claim 3, wherein said graph converting means further comprises graph separating means for individually outputting graphs separated by a net having at least one fanout from the first graph expression.

5. A technology mapping apparatus for automatically synthesizing an LSI logic circuit my mapping circuit elements of a combination circuit to cells which form said LSI logic circuit, comprising:
   graph converting means for converting functionally descriptive information expressing a combination circuit into a first graph expression having only NOR and inversion circuits;
   multiple input NOR converting means for detecting from the first graph expression a circuit element having a NOR circuit and an inversion circuit alternately connected in series and for converting said circuit element to a second graph expression where a multiple input NOR circuit replaces said circuit element; and cell mapping means for detecting from at least one of the first and second graph expressions a circuit element having NOR circuits connected together in series, and for mapping said circuit element to at least one of a plurality of sets of gate cells, at least some of the sets of the gate cells including a composite cell.

6. The technology mapping apparatus for automatically synthesizing an LSI logic circuit my mapping circuit elements of a combination circuit to cells which form said LSI logic circuit, according to claim 5, said graph converting means further comprises graph separating means for individually outputting graphs separated by a net having at least one fanout from the first graph expression.

7. The technology mapping apparatus for automatically synthesizing an LSI logic circuit by mapping circuit elements of a combination circuit to cells which form said LSI logic circuit, according to claim 5, wherein said cell mapping means outputs a mapping result with a minimum number of gate as a mapping output for said circuit element.

8. The technology mapping apparatus for automatically synthesizing an LSI logic circuit by mapping circuit elements of a combination circuit to cells which form said LSI logic circuit, according to claim 6, wherein said cell mapping means outputs a mapping result with a minimum number of gate as a mapping output for said circuit element.

9. The technology mapping apparatus for automatically synthesizing an LSI logic circuit by mapping circuit elements of a combination circuit to cells which form said LSI logic circuit, comprising:

graph converting means for converting functionally descriptive information expressing a combination circuit into a first graph expression having only NAND and inversion circuits;

multiple input NAND converting means for detecting from the first graph expression a circuit element having a NAND circuit and an inversion circuit alternately connected in series and for converting said circuit element to a second graph expression where a multiple input NAND circuit replaces said circuit element; and cell mapping means for detecting from at least one of the first and second graph expressions a circuit element having NAND circuits connected together in series, for mapping said circuit element to at least one of a plurality of sets of gate cells, at least some of the sets of the gate cells including a composite cell, and for outputting a mapping result with a minimum number of gates as a mapping output for said circuit element.

10. The technology mapping apparatus for automatically synthesizing an LSI logic circuit by mapping circuit elements of a combination circuit to cells which form said LSI logic circuit, according to claim 9, wherein said graph converting means further comprises graph separating means for individually outputting graphs separated by a net having at least one fanout from the first graph expression.

11. The technology mapping apparatus for automatically synthesizing an LSI logic circuit by mapping circuit elements of a combination circuit to cells which form said LSI logic circuit, comprising:

graph converting means for converting functionally descriptive information expressing a combination circuit into a first graph expression having only NAND and inversion circuits;

multiple input NAND converting means for detecting from the first graph expression a circuit element having a NAND circuit and an inversion circuit alternatively connected in series and for converting said circuit element to a second graph expression where a multiple input NAND circuit replaces said circuit element; and means for executing technology mapping for the second graph expression obtained by said multiple input NAND converting means.

12. The technology mapping apparatus for automatically synthesizing an LSI logic circuit by mapping circuit elements of a combination circuit to cells which form said LSI logic circuit, according to claim 11, wherein said graph converting means further comprises graph separating means for individually outputting graphs separated by a net having at least one fanout from the first graph expression.

13. A technology mapping apparatus for automatically synthesizing an LSI logic circuit by mapping circuit elements of a combination circuit to cells which form said LSI logic circuit, comprising:

graph converting means for converting functionally descriptive information expressing a combination circuit into a first graph expression having only NAND and inversion circuits;

multiple input NAND converting means for detecting from the first graph expression a circuit element having a NAND circuit and an inversion circuit alternatively connected in series and for converting said circuit element to a second graph expression where a multiple input NAND circuit replaces said circuit element; and cell mapping means for detecting from at least one of the first and second graph expressions a circuit element having NAND circuits connected together in series, for mapping said circuit element to at least one of a plurality of sets of gate cells, at least some of the sets of the gate cells including a composite cell.

14. The technology mapping apparatus for automatically synthesizing an LSI logic circuit by mapping circuit elements of a combination circuit to cells which form said LSI logic circuit, according to claim 13, wherein said graph converting means further comprises graph separating means for individually outputting graphs separated by a net having at least one fanout from the first graph expression.

15. The technology mapping apparatus for automatically synthesizing an LSI logic circuit by mapping circuit elements of a combination circuit to cells which form said LSI logic circuit, according to claim 13, wherein said cell mapping means outputs a mapping result with a minimum number of gates as a mapping output for said circuit element.

16. The technology mapping apparatus for automatically synthesizing an LSI logic circuit by mapping circuit elements of a combination circuit to cells which form said LSI logic circuit, according to claim 14, wherein said cell mapping means outputs a mapping result with a minimum number of gates as a mapping output for said circuit element.

* * * * *

UNITED STATES PATENT AND TRADEMARK OFFICE
CERTIFICATE OF CORRECTION

PATENT NO. : 5,311,442
DATED : May 10, 1994
INVENTOR(S) : Hisayo Fukushima

It is certified that error appears in the above-indentified patent and that said Letters Patent is hereby corrected as shown below:

Column 1, line 27 delete "(NAND)".

Column 5, line 37, "i" should be --J--;

line 47, "i" should be --J--.

Column 6, line 39, "least-number" should be --least number--.

Column 7, line 47, after "data" insert --as--.

Column 9, line 16, after "5," insert --wherein--;

line 33, "gate" should be --gates--.

Signed and Sealed this

Twenty-seventh Day of September, 1994

Attest:

BRUCE LEHMAN

*Attesting Officer*  *Commissioner of Patents and Trademarks*